United States Patent [19]

Orbach et al.

[11] Patent Number: 4,960,729
[45] Date of Patent: Oct. 2, 1990

[54] INTEGRATED CIRCUITS AND A METHOD FOR MANUFACTURE THEREOF

[75] Inventors: Zvi Orbach; Meir I. Janai, both of Haifa, Israel

[73] Assignee: Elron Electronic Industries Ltd., Haifa, Israel

[21] Appl. No.: 449,389

[22] Filed: Dec. 7, 1989

Related U.S. Application Data

[63] Continuation of Ser. No. 166,371, Mar. 10, 1988, abandoned.

[30] Foreign Application Priority Data

Mar. 10, 1987 [IL] Israel .......................................... 81849

[51] Int. Cl.$^5$ .......................................... H01L 21/283
[52] U.S. Cl. .................................. 437/101; 437/203; 437/195; 437/228; 437/19; 437/174
[58] Field of Search ............... 437/173, 174, 101, 203, 437/195, 19, 225, 228, 238, 235, 189, 922, 233, 241, 193, 194, 191; 148/DIG. 53

[56] References Cited

U.S. PATENT DOCUMENTS

| | | |
|---|---|---|
| 4,455,194 | 6/1984 | Yabu et al. . |
| 4,536,949 | 8/1985 | Takayama et al. . |
| 4,561,906 | 12/1985 | Calder ..................................... 437/19 |
| 4,585,490 | 4/1986 | Raffel ..................................... 437/198 |
| 4,602,420 | 7/1986 | Saito . |
| 4,617,723 | 10/1986 | Mukai . |
| 4,636,404 | 1/1987 | Raffel ..................................... 437/194 |
| 4,685,295 | 5/1987 | McDavid ............................ 437/922 |
| 4,720,908 | 1/1988 | Wills ..................................... 437/192 |
| 4,740,485 | 4/1988 | Sharpe-Geisler . |
| 4,751,197 | 6/1988 | Wills ..................................... 437/192 |
| 4,797,108 | 1/1989 | Crowther ............................ 437/101 |
| 4,800,179 | 1/1989 | Mukai . |
| 4,808,552 | 2/1989 | Anderson ............................ 437/203 |
| 4,832,789 | 5/1989 | Cochran ............................... 437/203 |
| 4,866,009 | 9/1989 | Matsuda ............................... 437/203 |

FOREIGN PATENT DOCUMENTS 0089814 9/1983 European Pat. Off. .
0175604 8/1985 European Pat. Off. .
53-78789 3/1978 Japan .

OTHER PUBLICATIONS

Raffel et al., "Laser Programmed Vias . . . ", IEDM, 12/80, pp. 132–135.
D. Platteter, IEEE Reliability Physics Symposium, 1976, p. 248.
J. Melnagalis et al., J. Nac. Sci. Technol., B4 (1), Jan. 1986, p. 176.
J. C. Logue et al., IBM J. Res. Develop., 25(3), May 1981, p. 107.
J. I. Raffel et al., "Laser-Formed Connections Using Polyimide", Appl. Phys. Lett., 42(8), Apr. 15, 1983.
J. A. Yasaitis et al., Low Resistance Laser Formed Lateral Links, IEEE Electron Device Letters, vol. EDL-3, No. 7, Jul. 1982.
J. I. Raffel et al., A Wafer-Scale Digital Integrator Using Restructable VSLI, IEEE Journal of Solid-State Circuits, vol. SC-20, No. 1, Feb. 1985, pp. 399–401.

Primary Examiner—Brian E. Hearn
Assistant Examiner—Kevin McAndrews
Attorney, Agent, or Firm—Kerkam, Stowell, Kondracki & Clarke

[57] ABSTRACT

A technique for providing a radiation formable conductive link in an integrated circuit comprising the steps of: depositing a plurality of aluminum conductors on an exposed surface of an otherwise completed integrated circuit, and forming a bridge of amorphous silicon layer joining the aluminum conductors at selected locations, whereby subsequent laser radiation produces diffusion of aluminum into the amorphous silicon, producing a highly conductive aluminum doped silicon bridge.

15 Claims, 1 Drawing Sheet

INTEGRATED CIRCUITS AND A METHOD FOR MANUFACTURE THEREOF

This is a continuation of application Ser. No. 166,371, filed Mar. 10, 1988, now abandoned.

FIELD OF THE INVENTION

The present invention relates to integrated circuits generally and more particularly to techniques for customization of integrated circuits.

BACKGROUND OF THE INVENTION

Various techniques for customization and alteration of integrated circuits have been proposed. Such techniques find potential application in integrated circuit design and testing as well as in redundant memory repair, where defective memory blocks are replaced by "stand by" working memory modules via alteration of the address decoder incorporated in the integrated circuit itself.

The introduction of changes in the routing of electrical conductors in an integrated circuit is inherently difficult due to the relatively small dimensions involved. The typical width of electrical conductors and the spacing between adjacent conductors in modern integrated circuits is about 1–3 microns.

It has been proposed to effect such rerouting by the use of an ultrasonic cutter followed by the application of a thin metal wire between elements to be connected. See D. Platteter, IEEE Reliability Physics Symposium, 1976, p 248.

It has also been proposed to employ a photolithographic process for customizing integrated circuits, involving the use of a laser or electron beam for direct pattern definition on a photoresist layer, followed by an etch process or a "lift off" metal definition process. See J. Melngailis, C.R. Musil, J. Nac. Sci. Technol. B4(1), Jan., 1986, page 176 and J.C. Logue, W.K. Kleinfelder, P. Lowy, J.R. Moulic, W.W. Wu. IBM J. Res. Develop. 25(3), May, 1981, p 107.

It has also been proposed to provide normally open electrical switches in integrated circuits for providing selectable connections between two normally electrically isolated locations. These electrical switches are imbedded in solid state devices and are closed by the application thereto of a laser pulse. Specifically it has been proposed to provide connections in integrated circuits by applying laser energy to a bridge formed of a polyimide insulator. See J I. Raffel, J.F. Freidin and G.H. Chapman, Laser-formed connections using polyimide, Appl. Phys. Lett. 42(8), 15 Apr., 1983. This technique suffers from the disadvantage that polyimides are relatively poor insulators.

It has also been proposed to produce laser formed links defined between two aluminum conductors deposited on insulating polysilicon. See J.A. Yasaitis, G.H. Chapman and J.I. Raffel, Low Resistance Laser Formed Lateral Links, IEEE Electron Device Letters, Vol EDL-3, No. 7. July, 1982. This proposal suffers from excessively high leak resistance due to the difficulty of attaining a suitable 12 nm $SiO_2$ layer as called for.

Additionally it has been proposed to produce laser formed links between two layers of aluminum conductor separated by a silicon dioxide, amorphous silicon sandwich. See J.I. Raffel, A.H. Anderson, et al, A Wafer-Scale Digital Integrator Using Restructurable VSLI, IEEE Journal of Solid-State Circuits, Vol SC-20, No. 1, Feb., 1985, pp 399–401. This technique is not susceptible of industrial application because of very high capacitances associated with relatively large switch areas.

There is shown in U.S. Pat. No. 4,636,404 a method and apparatus for reliably forming low resistance links between two aluminum conductors deposited on an insulating polysilicon or amorphous silicon layer, employing a laser to bridge a lateral gap between the conductors. The apparatus and method are suited for implementing defect avoidance using redundancy in large random access memories and in complex VLSI circuits. Only a single level of metal is employed and leads to both higher density and lower capacitance in comparison to prior techniques. Resistances in the range of one to ten ohms are achieved for gap widths of approximately two to three microns.

SUMMARY OF THE INVENTION

The present invention seeks to provide a technique for providing laser formable conductive links on integrated circuits, which overcomes many of the deficiencies of the prior art techniques.

There is thus provided in accordance with a preferred embodiment of the invention a technique for providing a radiation formable conductive link in an integrated circuit comprising the steps of:

depositing a plurality of aluminum conductors on an exposed surface of an otherwise completed integrated circuit; and forming a bridge of amorphous silicon layer joining the aluminum conductors at selected locations, whereby subsequent laser radiation produces diffusion of aluminum into the amorphous silicon, producing a highly conductive aluminum doped silicon bridge.

Further in accordance with a preferred embodiment of the invention there is provided a selectably configurable integrated circuit comprising:

a plurality of aluminum conductors disposed on an exposed surface of an otherwise completed integrated circuit; and a bridge of amorphous silicon layer joining the aluminum conductors at selected locations, whereby subsequent laser radiation produces diffusion of aluminum into the amorphous silicon, producing a highly conductive aluminum doped silicon bridge.

In accordance with a preferred embodiment of the invention, an anti-reflective coating may be provided over the bridge, whereby the laser power necessary for producing the aluminum doped silicon bridge may be reduced by approximately a factor of 2, thereby enabling a relatively low power laser to be employed for defining conductive links.

Further in accordance with a preferred embodiment of the present invention, the anti-reflective coating comprises $Si_3N_4$.

Additionally in accordance with a preferred embodiment of the invention, the thickness of the anti-reflective coating is typically 610 angstrom where an argon ion laser operating at a wavelength of 4880 angstrom is employed, 643 angstrom where a wavelength of 5140 angstrom is employed and 665 angstrom where a doubled frequency Nd-YAG laser is employed.

Additionally in accordance with an embodiment of the invention, a low-temperature passivation layer may be deposited over the amorphous silicon bridge to provide mechanical and chemical protection of the conductive links.

The apparatus and technique of the present invention have the following advantages:

1. The laser induced selectable linking is carried out on finished integrated circuits, without damaging them.

2. Relatively low laser power and radiation duration, typically 0.1 Watt over 1 msec focused on the amorphous silicon bridge, may be used as a result of employing the anti-reflective coating.

3. Standard materials and techniques well known in integrated circuit manufacturing are employed.

4. The links are relatively small in area and provide good insulation when in an open state, good conductivity when in a closed state and low capacitance.

According to a preferred embodiment of the present invention the amorphous silicon layer employed in the selectable contacts described above may be doped so as to further decrease its resistance following heating/radiation.

Where the selectable contact comprises a non-hydrogenated amorphous silicon bridge formed over aluminum conductors, the silicon may be doped with a p-type dopant, such as boron, at a concentration of between 0.1 and 5 percent.

BRIEF DESCRIPTION OF THE DRAWINGS

The Present invention will be understood and appreciated more fully from the following detailed description taken in conjunction with the drawings in which.

DETAILED DESCRIPTION OF THE INVENTION

Figure 1A:
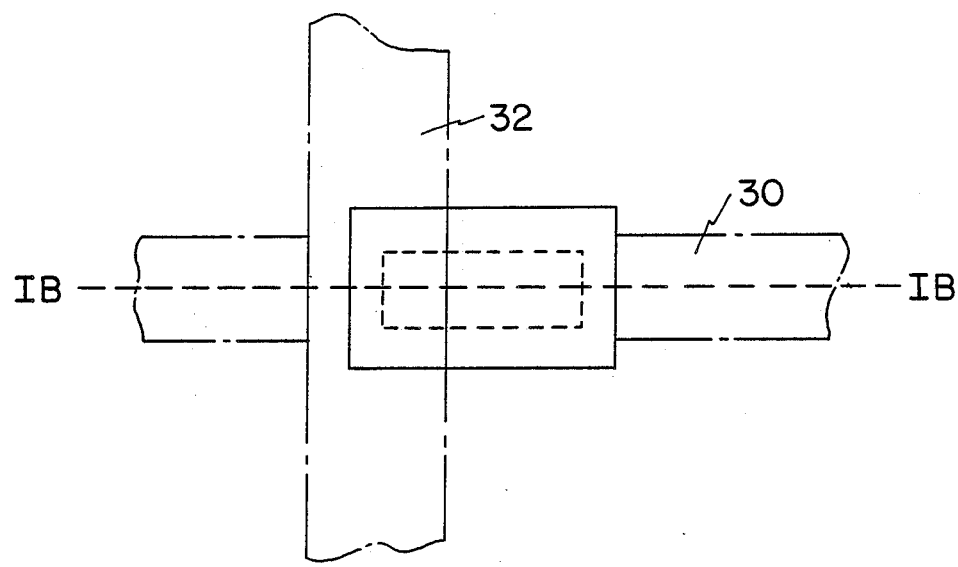
FIG 1A is a planar illustration of part of an integrated circuit constructed and operative in accordance with a preferred embodiment of the present invention, prior to laser energy application and showing a selectable contact joining two layers.
Figure 1B:
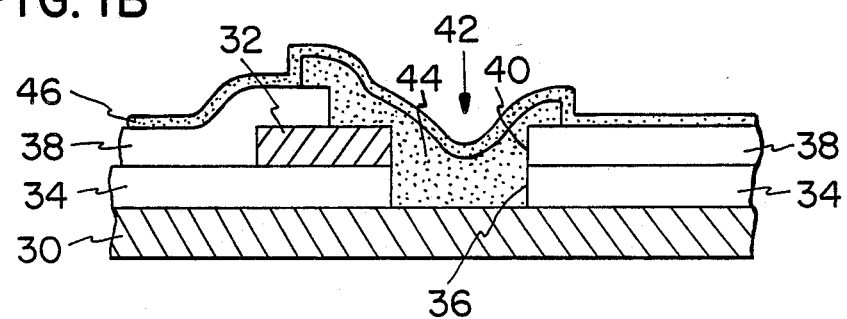
FIG. 1B is a side sectional illustration taken along the lines IB–IB in FIG. 1A.

Reference is now made to FIGS. 1A and 1B which illustrate selectable contacts joining a portion of a metal I layer 30 with a portion of a metal II layer 32. An insulating layer 34 is formed over the metal I layer 30 and defines a plurality of apertures 36. Metal II layer 32 is formed in a desired pattern over insulating layer 34 and is in electrical contact with the metal I layer 30 at apertures 36, i.e. vias (not shown).

A passivation layer 38 is formed over the insulating layer 34 and the metal II layer 32 and is provided with apertures 40, generally aligned with and typically formed together with apertures 36. A selectable contact 42 is defined by a layer of amorphous silicon 44 disposed over and in contact with the metal I layer 30 and the metal II layer 32. A passivation and/or anti-reflective coating 46 may be provided over layers 38 and 44. Coating 46 is a layer typically of thickness 610 angstrom where an argon ion laser operating at a wavelength of 4880 angstrom is employed, 643 angstrom where a wavelength of 5140 angstrom is employed and 665 angstrom where a doubled frequency Nd-YAG laser is employed.

The selectable contact structure seen in FIGS. 1A and 1B is in an open state. Each of selectable contacts 42 may be converted to a closed state by application thereto of heat to a temperature typically above 450 degrees centigrade for at least typically 100 microsecond. This may be achieved by the application of suitable radiation to a desired contact which produces diffusion of aluminum into the amorphous silicon, producing a highly conductive aluminum doped silicon bridge.

The radiation may be laser radiation of the types mentioned hereinabove or alternatively any other suitable type of radiation, including, for example, electron beam radiation and ion beam radiation.

According to a preferred embodiment of the present invention the amorphous silicon layer employed in the selectable contacts described above may be doped so as to further decrease its resistance following heating/radiation.

Where the selectable contact comprises a non-hydrogenated amorphous silicon bridge formed over aluminum conductors, the silicon may be doped with a p-type dopant, such as boron, at a concentration of between 0.1 and 5 percent. It is appreciated that boron at such concentration hardly affects conductivity of the non-hydrogenated non-irradiated amorphous silicon. Irradiation of the amorphous silicon, as by a laser, produces poly-crystalline silicon, whose conductivity is greatly enhanced by the doping.

Where metals other than aluminum are employed, the dopant type should be selected to provide matched doping in the contact bridge so as to avoid the formation of high resistivity rectifying junctions in the bridge.

It will be appreciated by persons skilled in the art that the present invention is not limited by what has been particularly shown and described hereinabove. Rather the scope of the present invention is defined only by the claims which follow.

We claim:

1. A technique for providing a direct radiation formable conductive link between first and second metal layers in an integrated circuit comprising the steps of:
   providing a first patterned metal layer on a substrate;
   providing an insulation layer over first patterned metal layer;
   providing a second patterned metal layer over said insulation layer;
   forming an aperture in said insulation layer through which adjacent, non-contacting portions of said first patterned metal layer and said second patterned metal layer are exposed; and
   after completion of all preceding steps, providing a layer of amorphous silicon contacting said first and second pattern metal layers at said aperture.

2. A technique according to claim 1 further comprising the step of selectably applying radiation directly to the layer of amorphous silicon for producing a conductive bridge joining said first and second patterned metal layers at said aperture.

3. A technique according to claim 1 further comprising the step of doping said layer of amorphous silicon.

4. A technique according to claim 2 further comprising the step of doping said layer of amorphous silicon.

5. A technique according to claim 3 wherein said step of doping comprises doping said layer of amorphous silicon with a p-type dopant.

6. A technique according to claim 5 wherein said type dopant comprises boron.

7. A technique according to claim 2 wherein said step of applying radiation comprises producing a doped silicon conductive bridge.

8. A technique according to claim 1 further comprising the step of providing an anti-reflective coating over the layer of amorphous silicon.

9. A technique according to claim 2 further comprising the step of providing an anti-reflective coating over the layer of amorphous silicon.

10. A technique according to claim 2, wherein said first and second patterned metal layers comprise aluminum conductors, and wherein said step of applying radiation comprises applying laser radiation to a selected layer of amorphous silicon, and producing a conductive pathway between said aluminum conductors.

11. A technique according to claim 2, wherein said first and second patterned metal layers comprise aluminum conductors, and wherein said step of applying radiation comprises applying ion beam radiation to a selected layer of amorphous silicon, and producing a conductive pathway between said aluminum conductors.

12. A technique according to claim 2, wherein said first and second patterned metal layers comprise aluminum conductors, and wherein said step of applying radiation comprises applying electron beam radiation to a selected layer of amorphous silicon, and producing a conductive pathway between said aluminum conductors.

13. A technique according to claim 8 wherein said anti-reflective coating comprises silicon nitride.

14. A technique according to claim 2 wherein said step of applying radiation includes the step of causing diffusion of said patterned metal layers into the layer of amorphous silicon.

15. A technique according to claim 2 wherein said step of applying radiation includes the step of causing crystallization of the layer of amorphous silicon.

* * * * *